(12) United States Patent
Noro et al.

(10) Patent No.: US 7,521,122 B2
(45) Date of Patent: Apr. 21, 2009

(54) LAMINATED SHEET

(75) Inventors: Hiroshi Noro, Ibaraki (JP); Koji Akazawa, Ibaraki (JP); Masayuki Yamamoto, Ibaraki (JP); Yasuhiko Yamamoto, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 154 days.

(21) Appl. No.: 10/876,651

(22) Filed: Jun. 28, 2004

(65) Prior Publication Data

US 2005/0008873 A1    Jan. 13, 2005

(30) Foreign Application Priority Data

Jul. 11, 2003  (JP) .............................. 2003-196113

(51) Int. Cl.
B32B 27/00 (2006.01)
H01L 21/00 (2006.01)

(52) U.S. Cl. ................. 428/423.1; 428/212; 428/195.1; 428/336; 428/423.7; 428/620; 29/592.1; 438/460

(58) Field of Classification Search .............. 428/423.1, 428/195.1, 336, 423.7, 620, 212; 29/592.1; 438/460

See application file for complete search history.

(56) References Cited

U.S. PATENT DOCUMENTS 6,350,664 B1    2/2002   Haji et al.
6,620,862 B2    9/2003   Ueda et al.
6,683,379 B2    1/2004   Haji et al.
2003/0001283 A1  1/2003   Kumamoto
2003/0183947 A1 10/2003   Ohuchi

FOREIGN PATENT DOCUMENTS

| JP | 2000-223602 A | 8/2000 |
| JP | 2001-144120 A | 5/2001 |
| JP | 2001-144123 A | 5/2001 |
| JP | 2001-144140 A | 5/2001 |
| JP | 2001-203255 A | 7/2001 |
| WO | WO-02/086003 A1 | 10/2002 |
| WO | WO-03/020816 A1 | 3/2003 |

*Primary Examiner*—Jennifer McNeil
*Assistant Examiner*—Lawrence D Ferguson
(74) *Attorney, Agent, or Firm*—Birch, Stewart, Kolasch & Birch, LLP

(57) ABSTRACT

A laminated sheet for adhering to a circuit side of a projected electrode-mounting wafer in a step of grinding a backside of the wafer, wherein the laminated sheet comprises at least a layer (layer A) contacting with the circuit side, made of a thermosetting resin, a layer (layer B) directly laminated on the layer A, made of a thermoplastic resin having a tensile modulus of from 1 to 300 MPa at 40° to 80° C., and an outermost layer (layer C) made of a thermoplastic resin which is non-plastic at a temperature of at least 25° C.; A method for manufacturing a semiconductor device, comprising the steps of grinding a backside of a projected electrode-mounting wafer wherein the laminated sheet is adhered to a circuit side of the wafer, removing other layers besides the layer A of the laminated sheet, and cutting the wafer into individual chips; and a semiconductor device obtainable by the method.

6 Claims, 8 Drawing Sheets

LAMINATED SHEET

This Non-provisional application claims priority under 35 U.S.C. § 119(a) on Patent Application No(s). 2003-196113 filed in Japan on Jul. 11, 2003, the entire contents of which are hereby incorporated by reference.

BACKGROUND OF THE INVENTION

1. Field of the Invention

The present invention relates to a laminated sheet usable in the manufacture of a semiconductor device, a method for manufacturing a semiconductor device using the sheet, and a semiconductor device which can be manufactured by the method.

2. Discussion of the Related Art

As the recent requirements accompanied by multi-functionality and miniaturization of a semiconductor device, a flip-chip mounting in which a semiconductor element is mounted on a wiring circuit board with a facedown structure has been carried out.

Generally, in the flip-chip mounting, resin encapsulation is carried out at a gap between a semiconductor element and a wiring circuit board in order to protect the semiconductor element. A conventional manufacturing method with flip-chip mounting comprises the step of creating patterns on a wafer, forming bumps, grinding the wafer to a given thickness, cutting the wafer into individual semiconductor elements, and mounting the semiconductor elements on a wiring circuit board and carrying out resin encapsulation.

There has been a defect that a thin wafer subjected to grinding has a low mechanical strength against an external force. As a measure for its improvement, there has been proposed to make up for the deficiency in mechanical strength of the wafer after grinding by previously resin-encapsulating a projection electrode-mounting wafer, and thereafter carrying out a backside grinding of the wafer (for instance, Japanese Patent Laid-Open No. 2001-144123). However, in order to form electrodes for mounting a semiconductor device on a wiring circuit board, there arises a problem that complicated steps of opening holes corresponding to the positions of the electrodes of the wafer in the resin-encapsulating layer, embedding solders to the open holes, and thereafter forming solder balls in the holes are necessitated.

In addition, there has been proposed a method comprising the steps of forming an adhesive film layer so as to completely cover the electrodes on the projection electrode-mounting wafer, subjecting the wafer to a backside grinding using the adhesive film as a projection electrode-protective layer, thereafter dividing the wafer into individual chips, and mounting on a circuit board (for instance, Japanese Patent Laid-Open No. 2001-144140). In this case, since the adhesive film layer completely covers the projection electrodes, the adhesive film layer which is an insulation is mechanically pushed away in an electric connection with the circuit board, so that electric connection must be secured, thereby causing a problem in connection reliability. Also, since the adhesive film layer completely covers the projection electrodes, a resin is applied in an amount exceeding that required for filling the gap between the semiconductor elements and the circuit board, so that an excess resin is pressed out in a wide range in the surroundings of the semiconductor elements after mounting the chips, thereby causing some problems in high-density mounting.

On the other hand, there has been proposed a method comprising coating a thermoplastic resin in an amount that exposes the top of the electrode of the projection electrode side of the wafer, thereafter adhering a tape with an adhesive layer to the thermoplastic resin and subjecting the wafer to a backside grinding (for instance, Japanese Patent Laid-Open No. 2000-223602). In the proposed method, after the backside grinding, the tape with an adhesive layer is stripped off, the wafer is divided into individual chips, and thereafter the chips are mounted on the circuit board with melting the thermoplastic resin. In this method, sufficient activity is necessary for uniformly applying the thermoplastic resin. Since a preferred embodiment proposes to drop a thermoplastic resin which plasticizes at about 150° C., while heating to 240° to 260° C., there arises a problem of failure in transporting the wafer by generation of bowing accompanied by the residual stress of the thermoplastic resin in the wafer after grinding.

SUMMARY OF THE INVENTION

Accordingly, an object of the present invention is to provide a laminated sheet which can be suitably used in flip-chip mounting, and is excellent in packing property of bumps, gives excellent workability of a wafer, and provides excellent electric connection reliability after resin encapsulation, a method for manufacturing a semiconductor device using the sheet, and a semiconductor device which can be manufactured by the method.

These and other objects of the present invention will be apparent from the following description.

According to the present invention, there are provided:

(1) a laminated sheet for adhering to a circuit side of a projected electrode-mounting wafer in a step of grinding a backside of the wafer, wherein the laminated sheet comprises at least:

a layer (layer A) contacting with the circuit side, made of a thermosetting resin;

a layer (layer B) directly laminated on the layer A, made of a thermoplastic resin having a tensile modulus of from 1 to 300 MPa at 40° to 80° C.; and an outermost layer (layer C) made of a thermoplastic resin which is non-plastic at a temperature of at least 25° C.;

(2) a method for manufacturing a semiconductor device, comprising the steps of grinding a backside of a projected electrode-mounting wafer wherein the laminated sheet of the above (1) is adhered to a circuit side of the wafer, removing other layers besides the layer A of the laminated sheet, and cutting the wafer into individual chips; and (3) a semiconductor device obtainable by the method of the above (2).

BRIEF DESCRIPTION OF THE DRAWINGS

The numerals used in FIGS. 1 to 8 are as follows.

1 denotes a layer A, 2 a layer B, 3 a layer C, 4 a wafer, 5 a projection electrode, 6 a dicing tape, 7 an individual chip, and 8 a wiring circuit board.

DETAILED DESCRIPTION OF THE INVENTION

The laminated sheet of the present invention is used by adhering the laminated sheet to a circuit side of the wafer in the step of grinding a backside of a projection electrode-mounting wafer, wherein one of the significant features of the laminated sheet resides in that the laminated sheet comprises at least:

a layer (layer A) contacting with the circuit side, made of a thermoplastic resin, a layer (layer B) directly laminated on the layer A, made of a thermoplastic resin having a tensile modulus of from 1 to 300 MPa at 40° to 80° C., and an outermost layer (layer C) comprising at least a non-plastic, thermoplastic resin layer at 25° C.

A method with flip-chip mounting, comprises the steps of grinding a projection electrode-forming wafer to a given thickness, cutting the wafer into individual semiconductor elements, mounting the semiconductor elements obtained on a wiring circuit board, and carrying out resin encapsulation. When the laminated sheet of the present invention is adhered to a circuit side on which projection electrodes exist, the projection electrodes are usually penetrated through the layer A and reach the layer B. However, the layer B has a plasticity into which the projection electrodes can be embedded and protects the electrodes with enveloping, and thereby the damages and the like of the projection electrodes during working of the wafer are prevented. In addition, since the laminated sheet of the present invention can be satisfactorily closely adhered to the circuit side, substantially no voids are generated between the projection electrodes and the sheet, so that the laminated sheet has an excellent packing property of bumps.

The wafer subjected to grinding has a low mechanical strength against an external force, but the mechanical strength of the wafer can be sufficiently increased by adhering the laminated sheet of the present invention having the layer C showing a definite mechanical strength to the circuit side of the wafer via the layer A, so that the wafer has substantially no cracks after grinding. Also, the bowing of the wafer after grinding can be prevented. Therefore, the wafer having excellent wafer-workability is obtained.

In addition, the laminated sheet of the present invention is usually used by removing (stripping off) other layers besides the layer A after the grinding of the wafer. The layer A has an encapsulation function capable of resin-encapsulating between semiconductor elements and the wiring circuit board. When a semiconductor device is manufactured by using the sheet, the resin encapsulation by the layer A takes place. Since the layer A usually comprises a thermosetting resin composition in an amount appropriate for resin encapsulation between the semiconductor elements and the wiring circuit board without covering the projection electrodes (usually, projection electrodes penetrating through the layer A), an excess resin would not be pushed away to the surroundings of the chip after mounting the chips, and the electric connection between the projection electrodes and the wiring board circuit is not inhibited, whereby the semiconductor device obtained has an excellent electric connection reliability.

The term "outermost layer" as used herein refers to a layer that faces the outermost side, forming an opposite side to the layer A of the laminated sheet of the present invention. Each of the pair of terms "projection electrodes" and "bumps," terms "cutting" and "dicing," and terms "chips," "semiconductor chips," and "semiconductor elements" are respectively used for the same meaning.

The layer A in the laminated sheet of the present invention is a thermosetting resin layer contacting with the circuit side of the projection electrode-mounting wafer upon its use. In the formation of the layer A, there may be used, for instance, a resin composition containing only an organic component, a resin composition containing an organic component and an inorganic component, a resin composition containing an organic component and metal particles, a resin composition containing an organic component, an inorganic component, and metal particles, and the like.

Among them, as the thermosetting resin composition constituting the layer A, a resin composition comprising (i) an epoxy resin having two or more epoxy groups in one molecule; (ii) a curing agent; (iii) a latent curing accelerator; and (iv) a thermoplastic resin is preferably used, from the viewpoints of improvements in heat resistance, moisture tolerance and adhesiveness. The details of the resin composition will be described later.

The thickness of the layer A is not particularly limited, and the thickness is preferably from 10 to 180 µm, more preferably from 20 to 160 µm.

The layer B in the laminated sheet of the present invention is a layer directly laminated on the layer A, which is a thermoplastic resin layer having a plasticity for embedding the projection electrodes. In the formation of the layer B, there may be used, for instance, polyvinyl chloride, polyvinylidene chloride, polyethyl vinyl acetate, polyethylene vinyl acetate, polyethylene methyl acrylate, polyethylene ethyl acrylate, polyethylene butyl acrylate, polytetrafluoroethylene, polyurethane, polyester-based polyurethane, polyether-based polyurethane, acrylic-urethane composite polymer and the like. These can be used alone or in admixture of two or more kinds.

In addition, the layer B has a tensile modulus of 1 to 300 MPa, preferably from 2 to 250 MPa, more preferably from 3 to 200 MPa at 40° to 80° C., from the viewpoints of improvements in packing property of bumps and its releasing property. By forming the layer B in an appropriate combination of the materials exemplified above, the layer B can have a desired tensile modulus. Therefore, the thermoplastic resin layer constituting the layer B has a plasticity such that the projection electrodes can be satisfactorily embedded when the laminated sheet of the present invention is adhered to the circuit side of the wafer, i.e. the projection electrodes can be intruded into the layer B.

The thickness of the layer B is not particularly limited, and the thickness is preferably from 25 to 200 µm, more preferably from 50 to 150 µm.

In addition, as the laminated sheet of the present invention, those satisfying the following formulas:

$At < h$ $(At + Bt) > h$ wherein a height of a projection electrode is denoted by h, a thickness of the layer A by At, a thickness of the layer B by Bt, are preferable. Here, h is preferably from about 10 to about 200 μm.

The layer C in the laminated sheet of the present invention is a thermoplastic resin layer which is non-plastic at a temperature of at least 25° C. Since the layer C is non-plastic at a temperature of at least 25° C., satisfactory workability of the wafer can be maintained in the grinding step in the flip-chip mounting. In the formation of the layer C, there may be used, for instance, polyethylene terephthalate, polypropylene, biaxially oriented polypropylene, polybutylene terephthalate, polycarbonate, polyimide and the like. These can be used alone or in admixture of two or more kinds.

In addition, as the layer C, it is desired to have a tensile modulus of preferably from 1000 to 3000 MPa, more preferably from 1500 to 2500 MPa at 40° to 80° C., from the viewpoints of maintaining the cutting workability of the laminated sheet itself upon cutting the wafer, and preventing cracks and bowing of the wafer after grinding. The layer C may have a desired tensile modulus by forming the layer C in an appropriate combination of the materials exemplified above.

The thickness of the layer C is not particularly limited, and the thickness is preferably from 25 to 150 μm, more preferably from 50 to 100 μm, from the viewpoints of maintaining the cutting workability of the laminated sheet itself upon cutting the wafer, and preventing cracks and bowing of the wafer after grinding.

The tensile modulus as used herein can be determined with, for instance, RSAII commercially available from RHEOMETRIC SCIENTIFIC under the condition of a frequency of 1 Hz.

The laminated sheet of the present invention comprises at least the layer A, the layer B and the layer C mentioned above, and is not particularly limited so long as the layer B is directly laminated on the layer A. One or more other layers made of any known materials may be provided between the layer B and the layer C, so long as the desired effects of the present invention are not inhibited. Incidentally, the thickness of the laminated sheet of the present invention is preferably from 50 to 500 μm, more preferably from 75 to 450 μm, even more preferably from 100 to 400 μm.

The resin composition comprising the components (i) to (iv) mentioned above, which can be suitably used in the formation of the above-mentioned layer A will be described in detail hereinbelow.

The epoxy resin having two or more epoxy groups in one molecule, which is the above-mentioned component (i), includes bisphenol A epoxy resins, bisphenol F epoxy resins, novolak epoxy resins such as phenol novolak epoxy resins and cresol novolak epoxy resins, alicyclic epoxy resins, nitrogen-containing cyclic epoxy resins such as triglycidyl isocyanurate and hydantoic epoxy resins, hydrogenated bisphenol A epoxy resins, aliphatic epoxy resins, hydrogenated bisphenol A epoxy resins, aliphatic epoxy resins, glycidyl ether epoxy resins, bisphenol S epoxy resins, biphenyl epoxy resins from which low water supply rate cured products are mainly prepared, dicyclo-ring epoxy resins, naphthalene epoxy resins, and the like. These epoxy resins can be used alone or in admixture of two or more kinds.

The above-mentioned epoxy resin may be solid or liquid at an ambient temperature. Those epoxy resins generally having an epoxy equivalence of preferably from 90 to 1000 g/eq are preferable, from the viewpoint of controlling mechanical strength and glass transition temperature of the layer A. The content of the epoxy resin in the thermosetting resin composition is preferably from 5 to 80% by weight, more preferably from 10 to 70% by weight, from the viewpoints of improvements in heat resistance and curability.

The curing agent, which is the above-mentioned component (ii), is not particularly limited, as long as the agents function as a curing agent for an epoxy resin, and various curing agents can be used. The phenolic curing agent is generally used from the viewpoint of having excellent moisture tolerance reliability, and various acid anhydride-based curing agents, amines, dicyandiamide, benzoxazine cyclic compounds and the like can be also used. These curing agents can be used alone or in admixture of two or more kinds.

The above-mentioned phenolic curing agent includes, for instance, cresol novolak resins, phenol novolak resins, phenolic resins containing dicyclopentadiene ring, phenol aralkyl resins, xylylene phenol resins, naphthol and the like. These phenolic curing agents can be used alone or in admixture of two or more kinds.

It is preferable that the composition ratio of the epoxy resin and the phenolic curing agent mentioned above is such that the reactive hydroxyl group equivalent in the phenolic curing agent is at a ratio of usually from 0.5 to 1.5 g/eq, preferably from 0.7 to 1.2 g/eq, per 1 g/eq of the epoxy equivalence in the epoxy resin, from the viewpoint of securing curability, heat resistance and moisture tolerance. Incidentally, even in a case where a curing agent other than the phenolic curing agent is used, the composition ratio is in accordance with the composition ratio (equivalence ratio) as in the case where the phenolic curing agent is used.

The latent curing accelerator, which is the above-mentioned component (iii), refers to those in which the layer A containing the latent curing accelerator has a reaction initiation temperature of 80° C. or more, as determined by a differential scanning calorimeter ("PYR1S1" commercially available from Perkin-Elmer) at a programming rate of 10° C./minute. The latent curing accelerator includes, for instance, imidazole-based latent curing accelerators, amine adduct-based latent curing accelerators, phosphorus-containing latent curing accelerators, boron-containing latent curing accelerators, phosphorus-boron-containing latent curing accelerators, organometallic complex-based latent curing accelerators and the like. In addition, a microcapsulated curing accelerator in which the latent curing accelerator is enveloped in a microcapsule is more preferably used. This is because in the layer A containing a microcapsulated curing accelerator, the shell portion prevents the physical contact between the core portion (latent curing accelerator) and the curing agent, so that the gelation of the layer A is suppressed in the soldering step, thereby showing excellent soldering property. Also, the undesired curing of the layer A during storage or the like can be suppressed, whereby the serviceable time is greatly extended, thereby giving an advantage of excellent storage stability.

Here, the above-mentioned microcapsulated curing accelerator is prepared in accordance with the method described in, for instance, Japanese Patent Laid-Open No. 2000-309682.

The above-mentioned latent curing accelerator may be used alone or in admixture of two or more kinds.

The content of the latent curing accelerator in the thermosetting resin composition suitably used in the formation of the layer A may be appropriately set in a ratio so that the desired curing rate is obtained and that soldering property and adhesiveness are not decreased. The setting method includes, for instance, a method comprising measuring the gelation time (index for curing rate) on a hot plate of the layer A containing a latent curing accelerator in various amounts, whereby the amount at which the desired gelation time is obtained is defined as its content. In general, the content of the latent curing accelerator in the thermosetting resin composition is preferably from 0.1 to 40 parts by weight, more preferably from 1 to 20 parts by weight, based on 100 parts by weight of the curing agent.

The thermoplastic resin, which is the above-mentioned component (iv), includes, for instance, alkyl esters of acrylic acid copolymers, acrylonitrile-butadiene copolymers, hydrogenated acrylonitrile-butadiene copolymers, styrene-butadiene-styrene copolymers, epoxy-modified styrene-butadiene-styrene copolymers, and the like. In addition, the content of these thermoplastic resins in the thermosetting resin composition is not particularly limited as long as the above-mentioned resin composition which is suitably used in the formation of the layer A can be formed into a sheet. The content of these thermoplastic resins in the thermosetting resin composition is preferably from 1 to 50% by weight, more preferably from 3 to 30% by weight, from the viewpoint of securing adhering property to the wafer, cutting workability and chip-mounting property.

In addition, there can be added to the thermosetting resin composition constituting the layer A an inorganic filler, a coupling agent, a pigment, a dye or the like as desired. The inorganic filler includes alumina, silica, silicon nitride, titanium oxide, zirconia and the like. The content of the inorganic filler in the thermosetting resin composition is not particularly limited. The content of the inorganic filler in the thermosetting resin composition is preferably from 0 to 70% by weight, more preferably from 0 to 65% by weight, from the viewpoints of controlling viscosity of the thermosetting resin composition and securing electric bonding between the semiconductor elements and the wiring circuit board.

The layer A can be, for instance, formed by using a suitable resin composition mentioned above as follows. Specifically, each of the components such as an epoxy resin, a curing agent, a latent curing accelerator, and a thermoplastic resin is blended in a given amount, and the mixture obtained is mixed and dissolved in an organic solvent such as toluene, methyl ethyl ketone or ethyl acetate, and this mixed solution is applied to a stripping sheet comprising a layer B and a layer C provided as described later (and additional other layers as desired). Next, the sheet is dried at a temperature of from about 80° to about 160° C., and thereafter the organic solvent is removed, thereby forming the layer A on the sheet. Alternatively, each of the components such as an epoxy resin, a curing agent, a latent curing accelerator, and a thermoplastic resin is blended in a given amount, and the mixture obtained is mixed and dissolved in an organic solvent such as toluene, methyl ethyl ketone or ethyl acetate, and this mixed solution is applied to a substrate film such as a polyester film subjected to a releasing treatment. Next, this applied substrate film is dried at a temperature of from about 80° to about 160° C., thereby forming the layer A on the substrate film.

Incidentally, each of the layer B and the layer C (and additional other layers as desired) constituting the above-mentioned stripping sheet can be formed by a conventionally known method such as a calendar method, a casting method, an inflation extrusion method, or a T die extrusion method.

In addition, the surface of the stripping sheet formed as described above may be subjected to a conventionally employed physical or chemical treatment, such as mat treatment, corona discharge treatment, primer treatment or cross-linking treatment as desired.

As the properties for the layer A formed as described above, the melt viscosity is preferably from 1 to 500 Pa.s, more preferably from 10 to 3000 Pa.s at 80° C., and the gelation time is preferably from 2 to 120 seconds, more preferably from 3 to 90 seconds at 175° C. The melt viscosity within the range mentioned above is preferable because packing property becomes excellent. The gelation time within the range mentioned above is preferable because molding operability becomes excellent.

The above-mentioned melt viscosity is determined for 1 g of the layer A at 80° C. using an E-type viscometer (RS1, commercially available from HAAKE), with setting a diameter of the plate to 20 mm, a gap to 100 µm, and a shearing rate to 10 (1/s).

In addition, the above-mentioned gelation time is determined according to the following procedures (1) to (5):
(1) A surface temperature of a hot plate is determined with a surface thermometer, and set at a given temperature.
(2) A 200 to 400 mg sample (the layer A) to be determined is taken and placed on the hot plate to allow quick spreading of the sample.
(3) At the same time as the melting of the sample, the determination for the gelation time is started with a stopwatch.
(4) The sample is stirred for 5 seconds, and thereafter thinly spread in a period of 10 seconds.
(5) A line is drawn with a needle tip, and a point at which the line is spread and scattered is defined as an end point, at which point the stopwatch is stopped, and time is read off. This time period is defined as the gelation time.

The laminated sheet of the present invention can be obtained by forming the layer A on the stripping sheet as described above, or alternatively adhering the layer A formed on the substrate film to the above-mentioned stripping sheet using a roll laminator, and removing the substrate film. The adhering conditions are not particularly limited, and the layer A can be adhered to the stripping sheet in accordance with known conditions.

Figure 1:
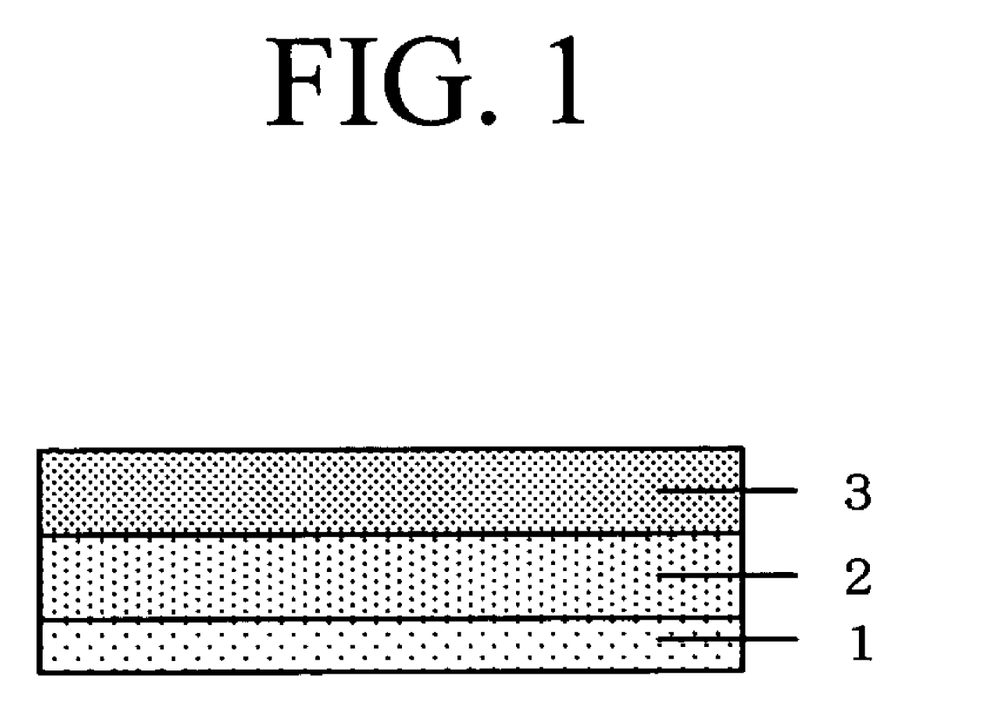
FIG. 1 shows one example of a laminated sheet of the present invention.

As described above, the laminated sheet of the present invention is obtained. One example of the sheet comprising the layer A, the layer B and the layer C is shown in FIG. 1, wherein a layer B 2 is laminated on a layer A 1, and a layer C 3 is laminated on the layer B 2.

Next, the method for manufacturing a semiconductor device of the present invention will be described. The method for manufacturing a semiconductor device of the present invention comprises the steps of grinding a backside of a projected electrode-mounting wafer wherein the laminated sheet of the present invention is adhered to a circuit side of the wafer, removing other layers besides the layer A of the laminated sheet, and cutting the wafer into individual chips. FIGS. 3 to 8 each shows one example of each step in the method for manufacturing a semiconductor device of the present invention. The method for manufacturing a semiconductor device of the present invention will be explained hereinbelow by referring to these drawings.

Figure 2:
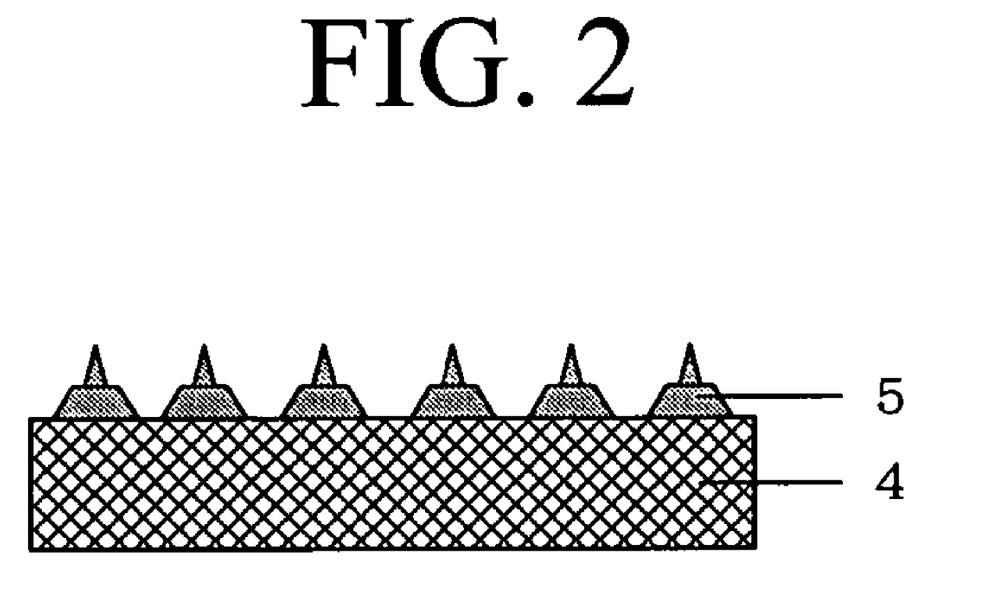
FIG. 2 is one example of a cross-sectional view of a projection electrode-mounting wafer.

One example of the projection electrode-mounting wafer is shown in FIG. 2, wherein projection electrodes 5 are formed on a wafer 4.

The materials of the wafer 4 usable in the present invention include, but not particularly limited to, silicon, gallium-arsenic and the like. The thickness of the wafer 4 is not particularly limited, and is preferably, for instance, from about 200 to about 1000 µm.

The projection electrode 5 includes, for instance, but not particularly limited to, low-melting point and high-melting point bumps obtained by soldering, tin bumps, silver-tin bumps, silver-tin-copper bumps, gold bumps, copper bumps and the like. The height of the projection electrode 5 is not particularly limited, and is preferably from 10 to 200 µm.

Figure 3:
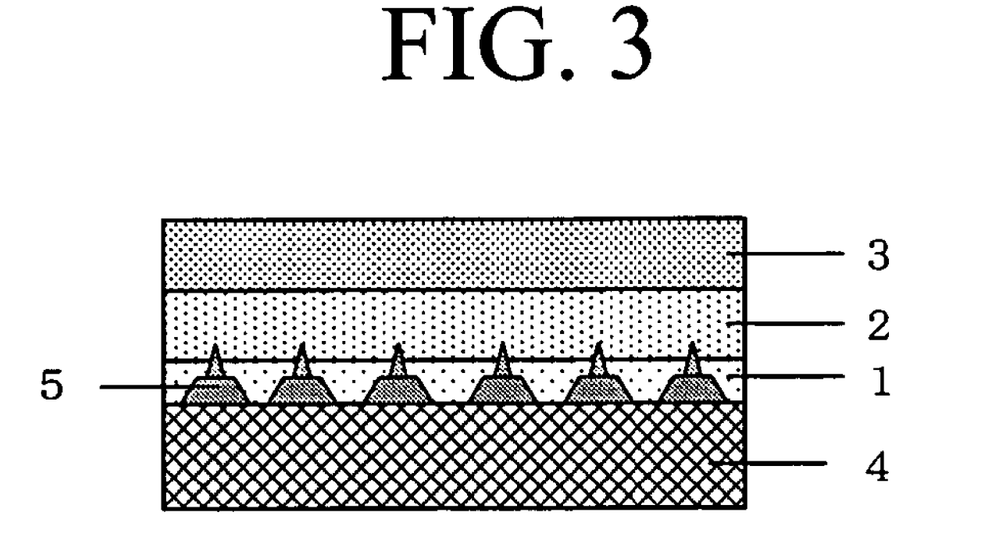
FIG. 3 is one example of an explanatory view showing the steps of the method for manufacturing a semiconductor device of the present invention.

One example in which the laminated sheet of the present invention (illustrated in FIG. 1) is adhered to the circuit side of the above-mentioned wafer is shown in FIG. 3, wherein the circuit side of the wafer 4 and the layer A 1 are contacted with each other, and the projection electrodes 5 are penetrated through the layer A 1, and embedded in the layer B 2. The projection electrodes 5 do not reach the layer C 3.

When the laminated sheet is adhered to the above-mentioned wafer, the roller-type adhering device and a vacuum-type adhering device is used. The adhering temperature is preferably from 25° to 100° C., more preferably from 40° to 80° C., from the viewpoints of reduction of voids, improvement in close contact of the wafer, and prevention of bowing of the wafer after grinding. In addition, the adhering pressure is appropriately set depending upon the adhering method, the adhering time and the like.

Figure 4:
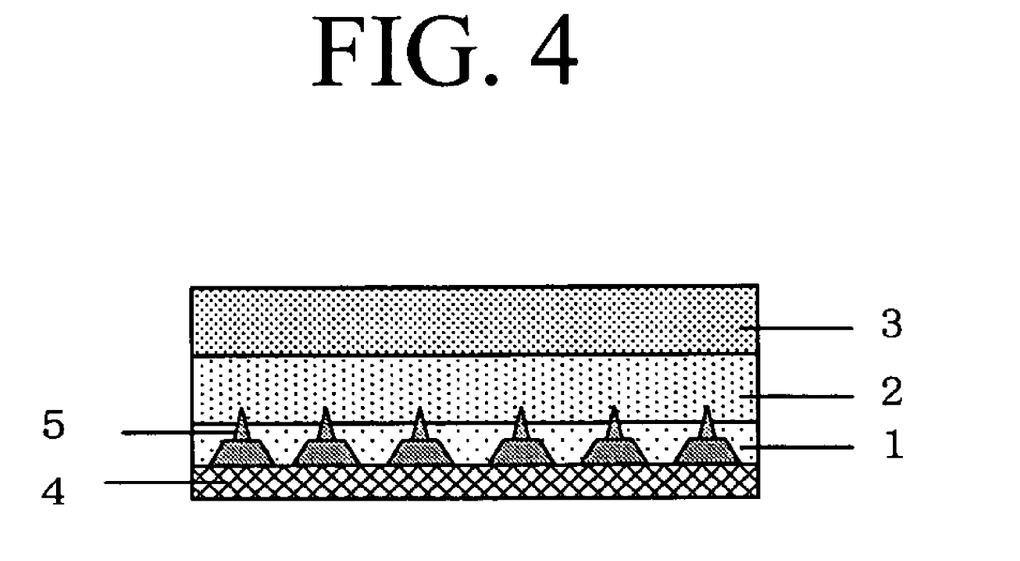
FIG. 4 is another example of an explanatory view showing the steps of the method for manufacturing a semiconductor device of the present invention.

One example of the wafer after grinding to which the above-mentioned laminated sheet is adhered is shown in FIG. 4, wherein the backside of the wafer 4 is subjected to grinding with keeping the laminated sheet adhered to the wafer 4.

In the grinding of the backside, the grinding device having a grinding stage is used without particular limitation. The grinding device includes a known device such as "DFG-840" commercially available from DISCO K.K. Also, the grinding conditions are not particularly limited. The thickness of the wafer after grinding is preferably from about 50 to about 600 μm.

Figure 5:
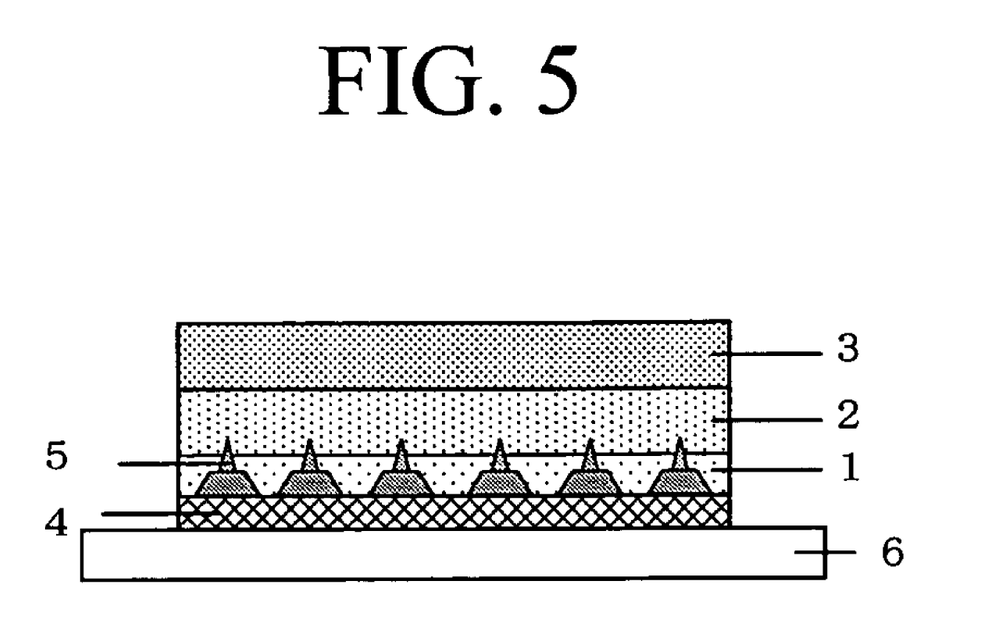
FIG. 5 is a still another example of an explanatory view showing the steps of the method for manufacturing a semiconductor device of the present invention.

One example where a dicing tape is adhered to a backside of the wafer after grinding (grinding side) is shown in FIG. 5, wherein a dicing tape 6 is adhered to a backside of the wafer 4 subjected to grinding.

The dicing tape usable in the present invention is not particularly limited, as long as the dicing tape is one which is usually used in the field of art.

The adhering device for the dicing tape and conditions are not particularly limited, and known devices and conditions can be employed.

Figure 6:
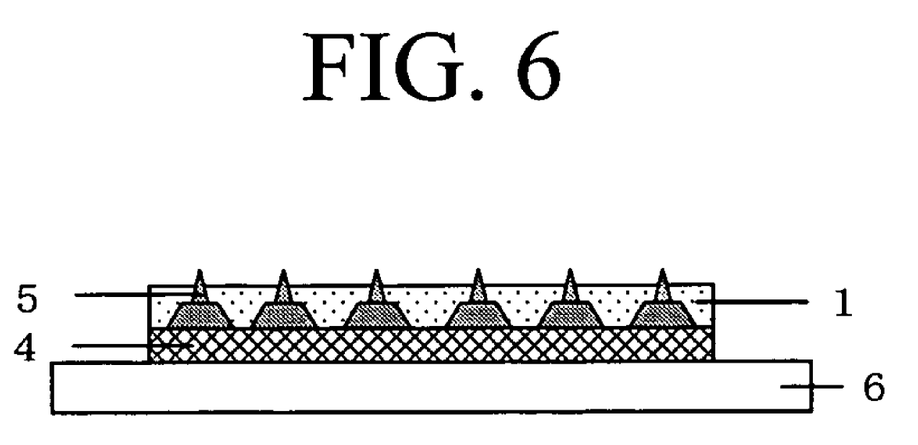
FIG. 6 is a still another example of an explanatory view showing the steps of the method for manufacturing a semiconductor device of the present invention.

One example of the wafer after removing the stripping sheet is shown in FIG. 6, wherein only the stripping sheet (the layer B 2 and the layer C 3) is removed out of the laminated sheet adhered to the wafer 4, thereby leaving only the layer A 1 on the wafer 4.

The removal of the stripping sheet is carried out by using, for instance, "HR-8500-II" commercially available from Nitto Denko Co., Ltd.

Figure 7:
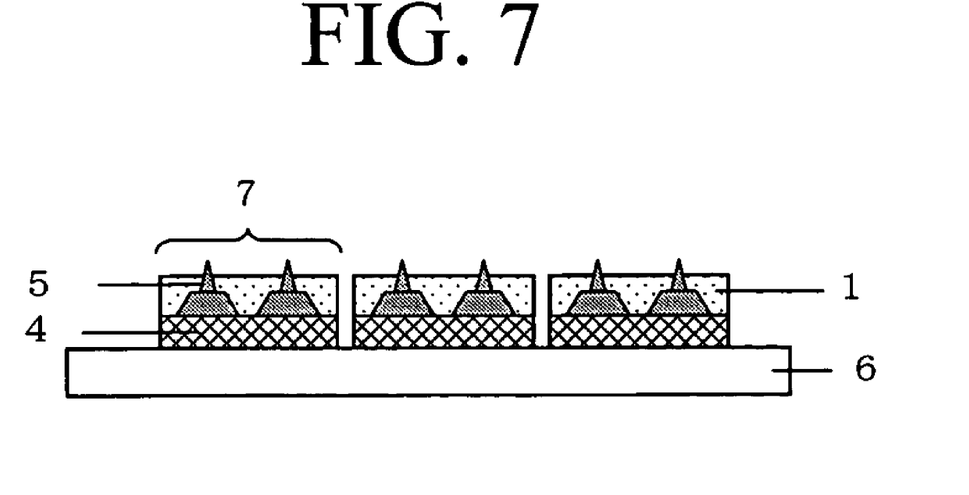
FIG. 7 is a still another example of an explanatory view showing the steps of the method for manufacturing a semiconductor device of the present invention.

One example after cutting (dicing) of the wafer is shown in FIG. 7, wherein the wafer 4 to which the layer A 1 is adhered is cut into individual chips with keeping the wafer 4 adhered to the dicing tape 6.

The cutting of the wafer is not particularly limited, and cutting is carried out with an ordinary dicing device.

In another embodiment, in the cutting of the wafer, when the transparency of the layer A is low and patterns and the like of the circuit side of the wafer cannot be recognized, the cutting can be carried out by adhering the dicing tape to the layer C, but not to the backside of the wafer, and carrying out pattern recognition using an infrared camera.

Figure 8:
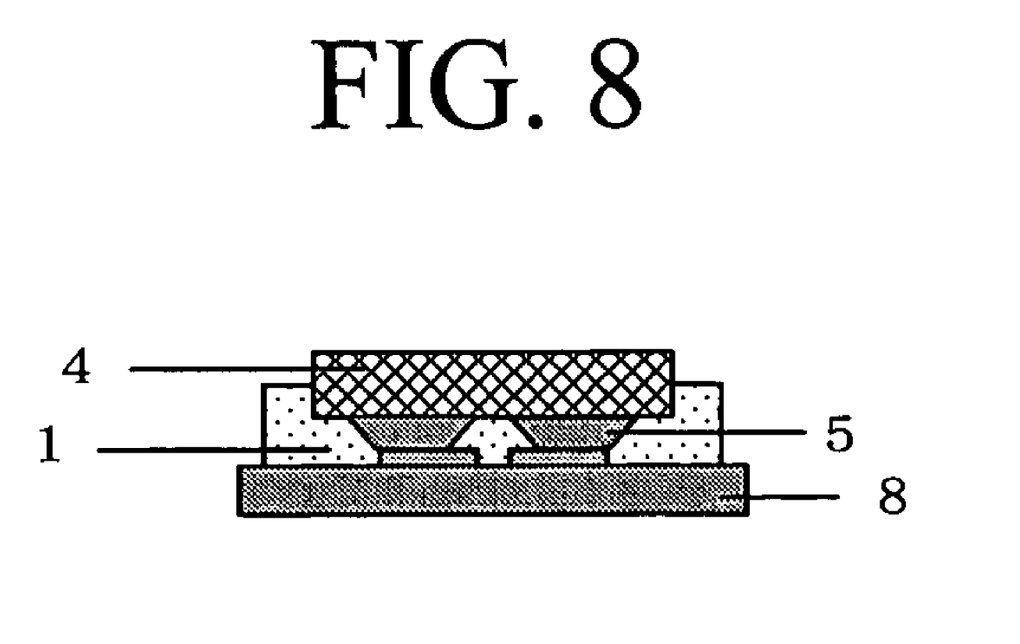
FIG. 8 is a still another example of an explanatory view showing the steps of the method for manufacturing a semiconductor device of the present invention.

One example of the method for mounting the chips is shown in FIG. 8, wherein the individual chips 7 are removed from the dicing tape, and mounted on a wiring circuit board 8. The gap between the wafer 4 and the wiring circuit board 8 is resin-encapsulated by the layer A 1.

The wiring circuit board 8 is not particularly limited and roughly classified into ceramic boards and plastic boards. The plastic board includes, for instance, epoxy board, bismaleimidotriazine board, polyimide board, glass epoxy board and the like.

The method for mounting individual chips 7 on a wiring circuit board includes a method comprising firstly picking up and removing the individual chips from a dicing tape, and housing the individual chips in a chip tray or conveying the individual chips to a chip-mounting nozzle of a flip-chip bonder; and thereafter (i) obtaining electric connection at the same time as mounting the semiconductor elements to the wiring circuit board, while pressing with heating in a bump-bonding form (heat-and-pressure mounting); (ii) obtaining an electric connection at the same time as mounting semiconductor elements to a wiring circuit board using heat, pressure and ultrasonication; (iii) mounting semiconductor elements to a wiring circuit board, and thereafter obtaining electric connection by solder reflow; and the like.

The above-mentioned heating temperature is preferably 500° C. or lower, more preferably 400° C. or lower, from the viewpoint of deterioration of the chips and the wiring circuit board. Although the above-mentioned pressure conditions depend on the number of connecting electrodes or the like, the pressure is preferably from $9.8 \times 10^{-3}$ to 1.96 N/chip, more preferably from $1.96 \times 10^{-2}$ to $9.8 \times 10^{-1}$ N/chip. The heating method includes a known method using an infrared reflow furnace, a dryer, a hot-air supplier, a hot plate, or the like.

According to the above method, a semiconductor device having excellent electric connection reliability and durability can be efficiently obtained. The semiconductor device obtained is encompassed in the present invention.

EXAMPLES

The present invention will be described more specifically by means of the following Examples, without intending to limit the scope of the present invention thereto.

Raw materials and parts used in Examples are collectively listed hereinbelow.

In the formation of the layer A, there were used a naphthalenic epoxy resin (epoxy equivalence: 141 g/eq.) as an epoxy resin, a xylylenic phenolic resin (hydroxyl equivalence: 174 g/eq.) as a curing agent, a microcapsulated triphenylphosphine (TPP) (shell: polyurea, core/shell ratio: 3/7 (wt/wt)) as a latent curing accelerator, an acrylonitrile-butadiene copolymer (degree of acrylonitrile bonds: 27%, Moonie viscosity: 70ML1+4/100° C.) as a thermoplastic resin, and a spherical silica (average particle size: 2 μm, a maximum particle size: 5 μm) as an inorganic filler.

In the formation of the layer B, an acrylic-urethane composite polymer, a polyvinyl chloride or polyethylene vinyl acetate was used.

In the formation of the layer C, polyethylene terephthalate, polypropylene or polyvinyl chloride was used.

As the projection electrode-mounting wafer, the following wafer was used.

size: 8 inch (about 200 mm);

thickness: 525 μm;

wire: Al;

projection electrodes: Au stud bumps;

height of projection electrodes: 85±10 μm;

number of projection electrodes: 240/10 mm² (individual chips);

electrode pitch: 135 μm; and passivation film: polyimide.

As the wiring circuit board, the following wiring circuit board was used.

material: glass epoxy;

wiring: Cu—Ni—Au;

wiring thickness: 35 μm

The evaluation methods are summarized hereinbelow.

(1) Thickness

The thickness of each layer was determined with DG205 commercially available from PEACOCK.

(2) Gelation Time

The surface temperature of a hot plate was determined with a surface thermometer, which was set so as to have a surface temperature of 175° C. A 200 to 400 mg sample to be determined was taken, and placed on the hot plate to allow quick spreading of the sample. At the same time as the melting of the sample, the determination was started with a stopwatch. The sample was stirred for 5 seconds, and thereafter thinly spread in a period of 10 seconds. Lines were drawn with a needle tip, and a point at which the lines were spread and scattered was defined as an end point, at which point the stopwatch was stopped and the time was read off. This time period was defined as the gelation time.

(3) Melt Viscosity

The melt viscosity was determined for 1 g of the layer A using an E-type viscometer (HAAKE commercially available from RS1) at 80° C. The diameter of the blade was set to 20 mm, a gap was set to 100 μm, and a shearing rate was set to 10 (1/s).

(4) Tensile Modulus

Each layer was cut into a size of 5 mm in width and 25 mm in length, and tensile modulus was determined with RSAII commercially available from RHEOMETRIC SCIENTIFIC at 40 to 80° C. The frequency was set at 1 Hz.

(5) Packing Property of Bumps

Voids in the surroundings of the bumps after adhering a laminated sheet to a wafer was visually confirmed. Packing property was evaluated in accordance with the following evaluation criteria:

[Evaluation Criteria]
No voids: ○
Voids: x (6) Cracking After Backside Grinding (BG) of Wafer The cracking of the wafer after grinding the backside of the wafer was visually confirmed, and evaluated in accordance with the following evaluation criteria:

[Evaluation Criteria]
No cracks: ○
Cracks: x (7) Amount of Wafer Bowed

A maximum amount bowed of the wafer after grinding the backside of the wafer was measured with a ruler, and evaluated in accordance with the following evaluation criteria:

[Evaluation Criteria]
Amount bowed being less than 3 mm: ○
Amount bowed being 3 mm or more: X (8) Electric Conductivity After Mounting Chips A procedure of keeping a semiconductor device at −40° C. for 5 minutes, and thereafter keeping the semiconductor device at 100° C. for 5 minutes with a thermal shock apparatus (TSB-5, commercially available from ESPEC Corp.). After this procedure, the electric conductivity of the semiconductor device was evaluated, and expressed as the number of unacceptable products out of 20 semiconductor devices. In the evaluation of the electric conductivity, the electric resistance of the semiconductor device was determined with a daisy chain (DIGITAL MULTIMETER TR6847 commercially available from ADVANTEST), and those not indicating the electric resistance were counted as unacceptable products.

(9) Amount of Resin Spread

The spread of the thermosetting resin composition constituting the layer A from the chip mounting area in the semiconductor device was determined, and evaluated in accordance with the following evaluation criteria:

[Evaluation Criteria]
Less than 1.5 mm: ○
1.5 mm or more: x (10) Evaluation of Solder Reflow The electric resistance of the semiconductor device after solder reflow at 260° C. was determined on the basis of JEDEC Level 3, and expressed as the number of unacceptable products out of 20 semiconductor devices. In this evaluation, the electric resistance of the semiconductor device was determined with a daisy chain (DIGITAL MULTIMETER TR6847 commercially available from ADVANTEST), and its electric resistance was compared to an initial value (electric resistance of a semiconductor device before carrying out the above-mentioned procedure). Those having electric resistance of 1.5 times that of the initial value were counted as unacceptable products.

(11) Thermal Cycle Test

A procedure of keeping the semiconductor device at −55° C. for 30 minutes, and thereafter keeping the semiconductor device at 125° C. for 30 minutes was carried out. Every 100 cycles of this procedure, the electric resistance of the semiconductor device was determined with a daisy chain (DIGITAL MULTIMETER TR6847 commercially available from ADVANTEST), and its electric resistance was compared to the initial value (electric resistance of the semiconductor device before carrying out the above-mentioned procedure). Thermal cycle test was expressed as the maximum number of thermal cycles for which this electric resistance is maintained at a value of 1.5 times or less of the initial value.

Examples 1 to 8 and Comparative Examples 1 to 5

The laminated sheets of Examples 1 to 8 and Comparative Examples 1 to 5 were formed as follows. The laminated sheet has the same shape as that shown in FIG. 1.

(1) Formation of Layer A

Each of the raw materials shown in Table 1 was mixed and dissolved in methyl ethyl ketone in a ratio shown in the same table, and this mixed solution was applied to a polyester film subjected to a releasing treatment. Next, the solution on the polyester film was dried at 120° C. for 5 minutes to remove methyl ethyl ketone, thereby forming each of the desired layer A (A1 to A3) having a thickness of 30 μm or 90 μm on the above-mentioned polyester film. The properties of the layer were determined.

TABLE 1

|  | Layer A | | |
| --- | --- | --- | --- |
|  | A1 | A2 | A3 |
| Raw Materials |  |  |  |
| Epoxy Resin (g) | 18.8 | 18.8 | 9.4 |
| Curing Agent (g) | 23.2 | 23.2 | 11.6 |
| Latent Curing Accelerator (g) | 2 | 2 | 1 |
| Thermoplastic Resin (g) | 6 | 6 | 3 |
| Silica (g) | 0 | 0 | 25 |
| Properties |  |  |  |
| Thickness (μm) | 30 | 90 | 30 |
| Gelation Time/175° C. (sec) | 13 | 13 | 13 |
| Melt Viscosity/80° C. (Pa · s) | 550 | 550 | 1100 |

(2) Formation of Layer B

The layer B (B1 to B6) was formed using the raw materials shown in Table 2. The properties of the layer were determined.

TABLE 2

| | Layer B | | | | | |
|---|---|---|---|---|---|---|
| Raw Materials | B1 Acrylic-Urethane Composite Polymer | B2 Acrylic-Urethane Composite Polymer | B3 Acrylic-Urethane Composite Polymer | B4 Acrylic-Urethane Composite Polymer | B5 Polyvinyl Chloride | B6 Polyethylene Vinyl Acetate |
| Properties | | | | | | |
| Thickness (μm) | 100 | 100 | 100 | 100 | 100 | 100 |
| Tensile       40° C. | 480 | 220 | 12 | 4 | 50 | 70 |
| Elasticity   80° C. | 390 | 150 | 4 | 3 | 6 | 10 |
| (MPa)       150° C. | 280 | — | — | — | — | — |

(3) Formation of Layer C

The layer C (C1 to C3) was formed using the raw materials shown in Table 3. The properties of the layer were determined.

TABLE 3

| | Layer C | | |
|---|---|---|---|
| Raw Materials | C1 Polyethylene Terephthalate | C2 Polypropylene | C3 Polyvinyl Chloride |
| Properties | | | |
| Thickness (μm) | 50 | 50 | 50 |
| Tensile       40° C. | 2200 | 1500 | 800 |
| Elasticity   80° C. | 2200 | 1500 | 750 |
| (MPa) | | | |

(4) Formation of Stripping Sheet

An acrylic-based adhesive layer having a thickness of 20 μm was adhered as an anchor to one side of the layer C formed as described above, thereby adhering the layer B and the layer C via the acrylic-based adhesive layer, to give a stripping sheet.

(5) Formation of Laminated Sheet

The layer A was adhered to the side of the layer B of the stripping sheet formed as described above at 60° C., to give a laminated sheet. Incidentally, each of the combinations of the layers A, B and C in the laminated sheet of each of Examples and Comparative Examples is shown in Tables 4 and 5.

TABLE 4

| | Ex. 1 | Ex. 2 | Ex. 3 | Ex. 4 | Ex. 5 | Comp. Ex. 1 | Comp. Ex. 2 |
|---|---|---|---|---|---|---|---|
| Layer A | A1 | A1 | A1 | A1 | A1 | A1 | A1 |
| Layer B | B2 | B3 | B4 | B5 | B6 | B1 | B1 |
| Layer C | C1 | C1 | C1 | C1 | C1 | C1 | C1 |

TABLE 5

| | Ex. 6 | Ex. 7 | Ex. 8 | Comp. Ex. 3 | Comp. Ex. 4 | Comp. Ex. 5 |
|---|---|---|---|---|---|---|
| Layer A | A3 | A1 | A1 | A1 | A2 | A1 |
| Layer B | B2 | B2 | B2 | B1 | B1 | B1 |
| Layer C | C1 | C1 | C2 | C3 | C1 | C1 |

Examples 9 to 16 and Comparative Examples 6 to 10

Semiconductor devices of Examples 9 to 16 and Comparative Examples 6 to 10 were produced as follows. Each of the laminated sheets of Examples 1 to 8 and Comparative Examples 1 to 5 formed as described above was adhered to a circuit board side of the projection electrode-mounting wafer with a roller adhering apparatus (DR-8500-II commercially available from Nitto Denko Co., Ltd.) at 40° C., 80° C. or 150° C. (see Tables 6 and 7). The wafer obtained was subjected to grinding to a thickness of 50 μm with a grinding apparatus (DFG-840, commercially available from DISCO). Thereafter, a dicing tape (DU-300, commercially available from Nitto Denko Co., Ltd.) was adhered to the wafer. Next, a stripping sheet was removed, and thereafter the wafer obtained was cut into individual chips with a dicing apparatus (DFD-651, commercially available from DISCO), to give a chip with the layer A.

TABLE 6

| | Ex. 9 | Ex. 10 | Ex. 11 | Ex. 12 | Ex. 13 | Comp. Ex. 6 | Comp. Ex. 7 |
|---|---|---|---|---|---|---|---|
| Laminated Sheet | Ex. 1 | Ex. 2 | Ex. 3 | Ex. 4 | Ex. 5 | Comp. Ex. 1 | Comp. Ex. 2 |
| Adhering Temp. to Circuit Board Side (° C.) | 40 | 40 | 40 | 40 | 40 | 40 | 80 |

TABLE 7

| | Ex. 14 | Ex. 15 | Ex. 16 | Comp. Ex. 8 | Comp. Ex. 9 | Comp. Ex. 10 |
|---|---|---|---|---|---|---|
| Laminated Sheet | Ex. 6 | Ex. 7 | Ex. 8 | Comp. Ex. 3 | Comp. Ex. 4 | Comp. Ex. 5 |
| Adhering Temp. to Circuit Board Side (° C.) | 40 | 80 | 80 | 40 | 80 | 150 |

Thereafter, semiconductor devices were produced by mounting chips with the layer A to a wiring circuit board using a flip chip bonder (FB30T-M, commercially available from Kyusyu Matsushita) according to heat-and-pressure mounting method (during mounting chips: temperature=120° C., pressure=9.8×10$^{-2}$ N/chip, time=3 seconds; during actual pressing: temperature=240° C., pressure=4.9×10$^{-1}$ N/chip, time=10 seconds). The semiconductor devices obtained were subjected to post-curing of the layer A using a drying furnace (PHH-100, commercially available from ESPEC Corp.), to give a desired semiconductor device.

Test Example

The above evaluations were made on the semiconductor devices produced in Examples 9 to 13 and Comparative Examples 6 and 7. The results are shown in Table 8.

TABLE 8

|  | Ex. 9 | Ex. 10 | Ex. 11 | Ex. 12 | Ex. 13 | Comp. Ex. 6 | Comp. Ex. 7 |
|---|---|---|---|---|---|---|---|
| Packing Property of Bumps | ○ | ○ | ○ | ○ | ○ | X | X |
| Cracks After BG | ○ | ○ | ○ | ○ | ○ | X | X |
| Amount of Wafer Bowed (mm) | ○ | ○ | ○ | ○ | ○ | — | — |
| Number of Unacceptable Products for Electric Conductivity After Mounting Chips | 0/20 | 0/20 | 0/20 | 0/20 | 0/20 | — | — |
| Amount of Wafer Spread (mm) | ○ | ○ | ○ | ○ | ○ | — | — |
| Number of Unacceptable Products for Solder Reflow | 0/20 | 0/20 | 0/20 | 0/20 | 0/20 | — | — |
| Number of Thermal Cycles | 500 | 500 | 500 | 500 | 500 | — | — |

It can be seen from the results of Table 8 that the semiconductor devices produced in Examples 9 to 13 exhibit excellent evaluation results in any of the evaluation items. On the other hand, it can be seen that the semiconductor devices produced in Comparative Examples 6 and 7 each has a tensile modulus of the layer B exceeding 300 MPa at 40° C. and 80° C., so that the packing property for bumps is worsened and cracks after BG is generated, whereby excellent semiconductor devices cannot be obtained.

The above evaluations were made on the semiconductor devices produced in Examples 14 to 16 and Comparative Examples 8 to 10. The results are shown in Table 9.

TABLE 9

|  | Ex. 14 | Ex. 15 | Ex. 16 | Comp. Ex. 8 | Comp. Ex. 9 | Comp. Ex. 10 |
|---|---|---|---|---|---|---|
| Packing Property of Bumps | ○ | ○ | ○ | ○ | ○ | ○ |
| Amount of Wafer Bowed (mm) | ○ | ○ | ○ | X | ○ | X |
| Number of Unacceptable Products for Electric Conductivity After Mounting Chips | 0/20 | 0/20 | 0/20 | — | 3/20 | — |
| Amount of Resin Spread (mm) | ○ | ○ | ○ | — | X | — |
| Number of Unacceptable Products for Solder Reflow | 0/20 | 0/20 | 0/20 | — | — | — |
| Number of Thermal Cycles | 1000 | 500 | 500 | — | — | — |

It can be seen from the results of Table 9 that in the semiconductor devices produced in Examples 14 to 16, when the layer C has a tensile modulus within the range of from 1000 to 3000 MPa, excellent evaluation results are exhibited regardless of the content of each of the raw materials constituting the layer A and regardless of the raw materials constituting the layer C.

On the other hand, it can be seen that the semiconductor device produced in Comparative Example 8 does not satisfy the evaluation criteria for the amount of wafer bowed, even though the semiconductor device has favorable results for packing property of bumps and cracks after BG as compared to those semiconductor devices produced in Comparative Examples 6 and 7.

In addition, it can be seen that the semiconductor device produced in Comparative Example 9 results in the electric conductivity failure after mounting the chips, even though the semiconductor device has favorable results in packing property of bumps, cracks after BG, and amount of wafer bowed, and further that the amount of resin spreading does not satisfy the evaluation criteria.

Further, it can be seen that in the semiconductor device produced in Comparative Example 10, the layer B has a tensile modulus within the range of from 1 to 300 MPa at 150° C. (see Table 2). Therefore, the semiconductor device does not satisfy the evaluation criteria for the amount of wafer bowed, even though favorable results are shown in packing property of bumps and cracks after BG.

The laminated sheet of the present invention has excellent packing property of bumps and gives excellent wafer workability, and can be used for resin encapsulation between a semiconductor element and a wiring circuit board. Also the laminated sheet can guarantee excellent electric connection reliability of the semiconductor device. The above sheet can be adhered to the circuit side of the wafer circuit board without generating voids, so that there are no generation of bowing of the wafer after backside grinding of the wafer and push-away of the resin to the surroundings of the resin. Accordingly, a semiconductor device can be efficiently manufactured by using the above sheet.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A laminated sheet for adhering to a circuit side of a projected electrode-mounting wafer in a step of grinding a backside of the wafer, wherein the laminated sheet comprises at least:
   a layer (layer A) contacting with the circuit side, made of a thermosetting resin;
   a layer (layer B) directly laminated on the layer A, made of a thermoplastic resin having a tensile modulus of from 1 to 300 MPa at 40 ° to 80° C.; and
   an outermost layer (layer C) directly laminated on the layer B, comprising at least a non-plastic thermoplastic resin layer at 25° C.,
   wherein h, At and Bt satisfy the relationships of:

$At < h$ and $(At + Bt) > h$, wherein h is a height of the projected electrode, At is thickness of the layer A, and Bt is a thickness of the layer B,
   wherein the layer C has tensile modulus of from 1000 to 3000 Mpa at 40° to 80 ° C.

2. The laminated sheet according to claim 1, wherein At is from 10 to 180 μm, and Bt is from 25 to 200 μm.

3. The laminated sheet according to claim 2, wherein h is from 10 to 200 μm.

4. The laminated sheet according to claim 1, wherein a thermosetting resin composition constituting the layer A comprises:
   (i) an epoxy resin having two or more epoxy groups in one molecule;
   (ii) a curing agent;
   (iii) a latent curing accelerator; and
   (iv) a thermoplastic resin.

5. A method for manufacturing a semiconductor device, comprising the steps of grinding a backside of a projected electrode-mounting wafer wherein the laminated sheet of any one of claims 1 and 2-4 is adhered to a circuit side of the wafer, removing other layers besides the layer A of the laminated sheet, and cutting the wafer into individual chips.

6. A semiconductor device obtainable by the method of claim 5.

* * * * *